United States Patent
Kaneko

(10) Patent No.: US 9,037,432 B2
(45) Date of Patent: May 19, 2015

(54) WIRELESS PROBE CARD VERIFICATION SYSTEM AND METHOD

(75) Inventor: Susumu Kaneko, Tokyo (JP)

(73) Assignee: FormFactor, Inc., Livermore, CA (US)

(*) Notice: Subject to any disclaimer, the term of this patent is extended or adjusted under 35 U.S.C. 154(b) by 537 days.

(21) Appl. No.: 13/418,532

(22) Filed: Mar. 13, 2012

(65) Prior Publication Data

US 2012/0239339 A1 Sep. 20, 2012

Related U.S. Application Data

(60) Provisional application No. 61/453,443, filed on Mar. 16, 2011.

(51) Int. Cl.
*G01R 31/00* (2006.01)
*G01R 31/302* (2006.01)
*G01R 1/073* (2006.01)
*G01R 31/28* (2006.01)

(52) U.S. Cl.
CPC ........ *G01R 31/3025* (2013.01); *G01R 1/07378* (2013.01); *G01R 31/2889* (2013.01)

(58) Field of Classification Search
CPC .... G01R 31/3025; G01R 31/31903–31/31905; G01R 31/2889
See application file for complete search history.

(56) References Cited

U.S. PATENT DOCUMENTS

| | | | |
|---|---|---|---|
| 5,216,361 A * | 6/1993 | Akar et al. | 324/754.18 |
| 5,323,107 A | 6/1994 | D'Souza | |
| 6,882,239 B2 | 4/2005 | Miller | |
| 7,202,687 B2 | 4/2007 | Khandros et al. | |
| 7,218,094 B2 | 5/2007 | Khandros et al. | |
| 7,253,651 B2 | 8/2007 | Khandros et al. | |
| 7,466,157 B2 | 12/2008 | Miller | |
| 2005/0237073 A1 * | 10/2005 | Miller et al. | 324/754 |
| 2006/0179374 A1 * | 8/2006 | Noble | 714/727 |
| 2008/0100320 A1 | 5/2008 | Miller et al. | |
| 2009/0066350 A1 | 3/2009 | Lee et al. | |
| 2010/0169481 A1 | 7/2010 | Hung | |
| 2011/0156735 A1 | 6/2011 | Breinlinger et al. | |

OTHER PUBLICATIONS

WO 2012/125606 (Int'l application No. PCT/US2012/028869), International Preliminary Report on Patentability (Sep. 17, 2013), 6 pages.
PCT application No. PCT/US2012/028869, Int'l Search Report (Oct. 23, 2012), 3 pages.
PCT application No. PCT/US2012/028869, Written Opinion of the Int'l Searching Authority (Oct. 23, 2012), 5 pages.

* cited by examiner

*Primary Examiner* — Mischita Henson
(74) *Attorney, Agent, or Firm* — Kirton McConkie

(57) ABSTRACT

A probe card assembly can include a wireless link to an external verifier (e.g., debugger). The wireless link can interface to a boundary scan interface of a controller on the probe card assembly. The wireless link can allow for verification of the probe card assembly while it is installed within a prober.

29 Claims, 7 Drawing Sheets

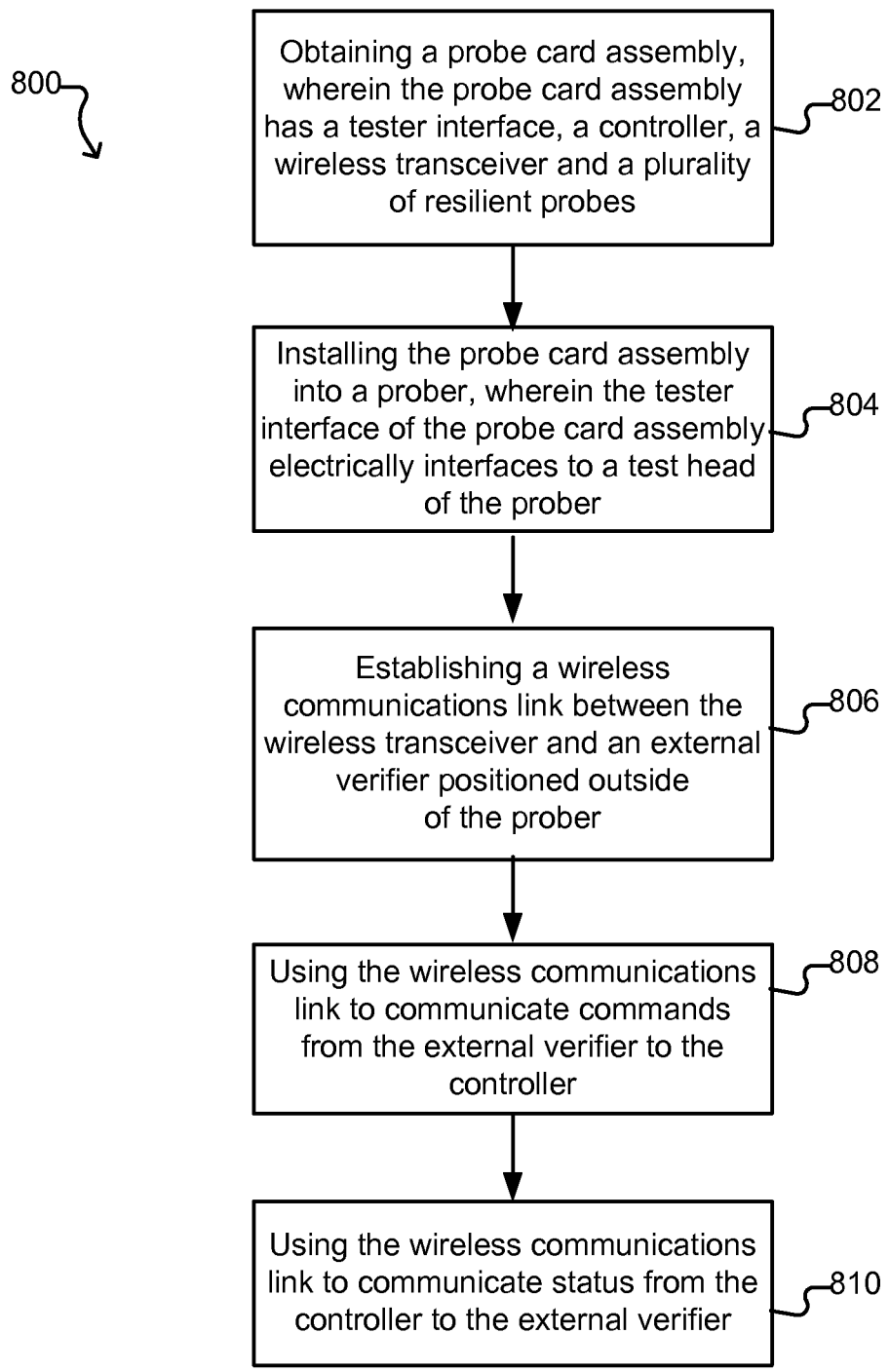

WIRELESS PROBE CARD VERIFICATION SYSTEM AND METHOD

CROSS REFERENCE TO RELATED APPLICATION(S)

This application is a non-provisional (and thus claims the benefit of the filing date) of U.S. provisional patent application Ser. No. 61/453,443 (filed Mar. 16, 2011), which is incorporated herein by reference in its entirety.

BACKGROUND

A probe card assembly can be used to make temporary contact with a microelectronic device (e.g., a wafer comprising a plurality of dies) during testing. Typically, the probe card assembly is installed in a prober and an upper portion of the probe card assembly is docked to a test head. The device to be tested is placed on a chuck (or stage) and brought into contact with probes disposed on a lower surface of the probe card. A tester can then communicate with (e.g., provide test and control signals to and receive response signals from) the device to be tested through the test head and the probe car assembly.

As wafers have become larger, probe card assemblies have become correspondingly larger, with larger numbers of probes to make temporary connection by contacting dies on the wafer. In order to accommodate limited capabilities of testers, test circuitry can be included on the probe card to allow more dies to be tested in parallel. For example, the test circuitry on the probe card assembly can duplicate or split signals from the tester, allowing one tester channel to drive multiple dies. As another example, the test circuitry on the probe card assembly can include circuitry for checking response signals from multiple dies and providing summary fault information back to the tester. Other, more complex test circuitry can also be included on the probe card assembly.

During the process of developing a probe card assembly, it is often necessary to verify (e.g. debug) the probe card assembly to indentify and isolate problems. In some instances, problems cannot be detected until the probe card assembly has been installed in a prober (e.g., attached to the prober and/or docked to the test head). Unfortunately, once the probe card assembly has been installed into the prober, physical access to the probe card assembly to connect external test equipment (e.g., an oscilloscope probe, logic analyzer, or digital voltmeter) is difficult or impossible. Accordingly, it can be difficult to verify a probe card assembly.

SUMMARY

In some embodiments of the invention a probe card assembly is provided. The probe card assembly can include a plurality of resilient probes disposed on a first substrate and arranged to contact corresponding pads of a device under test. The probe card assembly also includes a tester interface. A test circuit is electrically coupled to the tester interface and to the probes. A controller is coupled to the test circuit and includes a boundary scan interface. A wireless transceiver is coupled to the boundary scan interface and can establish a wireless communications link with an external verifier (e.g., debugger).

In some embodiments of the invention a wireless verification attachment for a probe card assembly is provided. The wireless verification attachment can include a substrate sized to fit within a space between a test head and a probe card assembly when installed in a prober. An electrical connector can be positioned on the substrate to mechanically and electrically interface to a boundary scan electrical connector disposed on the probe card assembly. A wireless transceiver can be coupled to the boundary scan electrical connector and capable of establishing a wireless communications link with an external verifier (e.g., debugger).

In some embodiments of the invention a method of probe card verification is provided. The method can include installing a probe card assembly into a proper. The probe card assembly can include a tester interface, a controller electrically coupled to the tester interface, a wireless transceiver electrically coupled to the controller via a boundary scan interface, and a plurality of resilient probes coupled to the controller. The method can also include establishing a wireless communications link between the wireless transceiver and an external verifier (e.g., debugger) positioned outside of the prober. Another operation can be using the wireless communications link to communicate commands from the external verifier (e.g., debugger) to the controller and using the wireless communications link to communicate status from the controller to the external verifier (e.g., debugger). The controller can controls operation of the probe card assembly.

BRIEF DESCRIPTION OF THE DRAWINGS

FIG. 8 illustrates a flow chart of a method of using a probe card assembly according to some embodiments of the invention.

DETAILED DESCRIPTION OF EXEMPLARY EMBODIMENTS

Figure 1A:
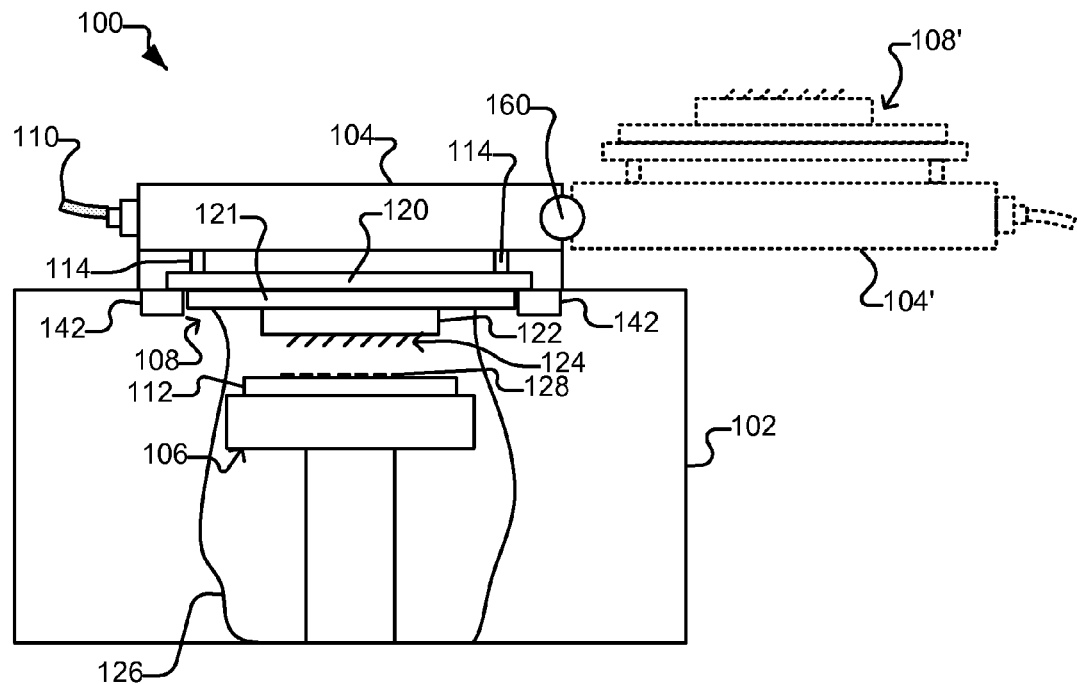
FIG. 1A illustrates a side view of a test system according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on or attached to or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In some figures, "x," "y," and "z" axes are provided in accordance with a right-hand coordinate system for ease of discussion and illustration but not by way of limitation. With reference to particular directions or orientations, the term "substantially" may be used, by which it is to be understood that the recited direction or orientation need not be exact, but may include deviations or variations, including for example, tolerances, measurement error, measurement accuracy limitations, conversion factors, rounding off, and other factors known to skill in the art. Similarly, the term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. In addition, where reference is made to a list of elements (e.g., elements a, b, c), such reference is intended to include any one of the listed elements by itself, any combination of less than all of the listed elements, and/or a combination of all of the listed elements. In addition, where reference is made to a range of values, such reference is intended to include not only the explicitly recited range, but also all the individual values and sub-ranges encompassed within that range.

In accordance with some embodiments of the invention, it would be desirable to be able to verify (e.g., debug) a probe card assembly while the probe card assemble is installed in a prober (e.g., attached to the prober or docked to a test head). As introduced above, however, once the probe card assembly is installed in a prober, it is difficult or impossible to access the probe card assembly to connect test equipment to verify the probe card assembly. While in some instances, it may be possible to temporarily solder or otherwise connect a wire or wires from test equipment outside of the prober (and/or the tester to which the prober is connected) to the probe card assembly to verify or otherwise test the probe card assembly, such a solution has various problems. It can be very difficult to pull a wire through the narrow interspace between the probe card assembly and the test head. Moreover, even if a wire or wires can be pulled through the interspace between the probe card assembly and the test head, only limited numbers of wires can be provided through the space. In addition, soldering is not generally permitted within the wafer fabrication environment in which probers are typically operated. Hence the probe card assembly would need to be moved from the fabrication environment in order to solder wires from test equipment to the probe card assembly. The necessary wire length to get from the probe card assembly to outside the prober (or a tester to which the prober is connected) can be long, and such a long wire can cause problems with noise, signal degradation, and undesired loading. Accordingly, attaching wires from test equipment to the probe card assembly to verify or otherwise test the probe card assembly is not generally practical.

Figure 1B:
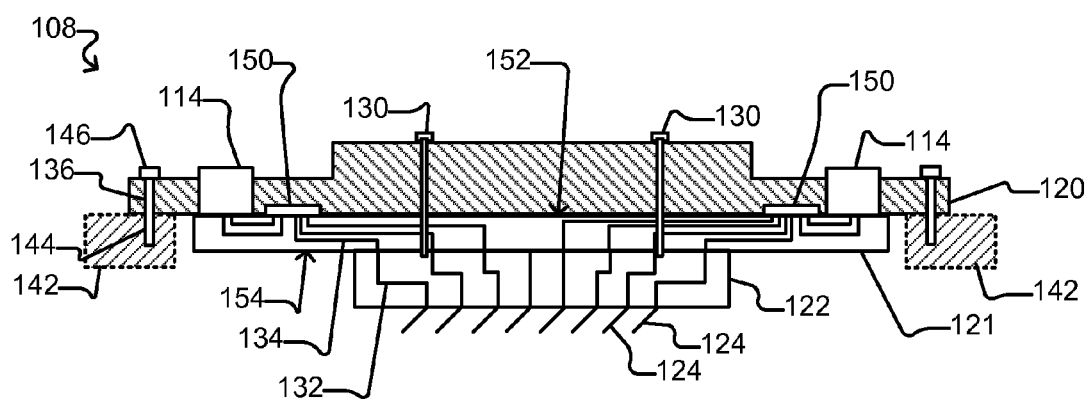
FIG. 1B illustrates a detailed cross-section side view of the probe card assembly of the test system of FIG. 1A according to some embodiments of the invention.
Figure 1C:
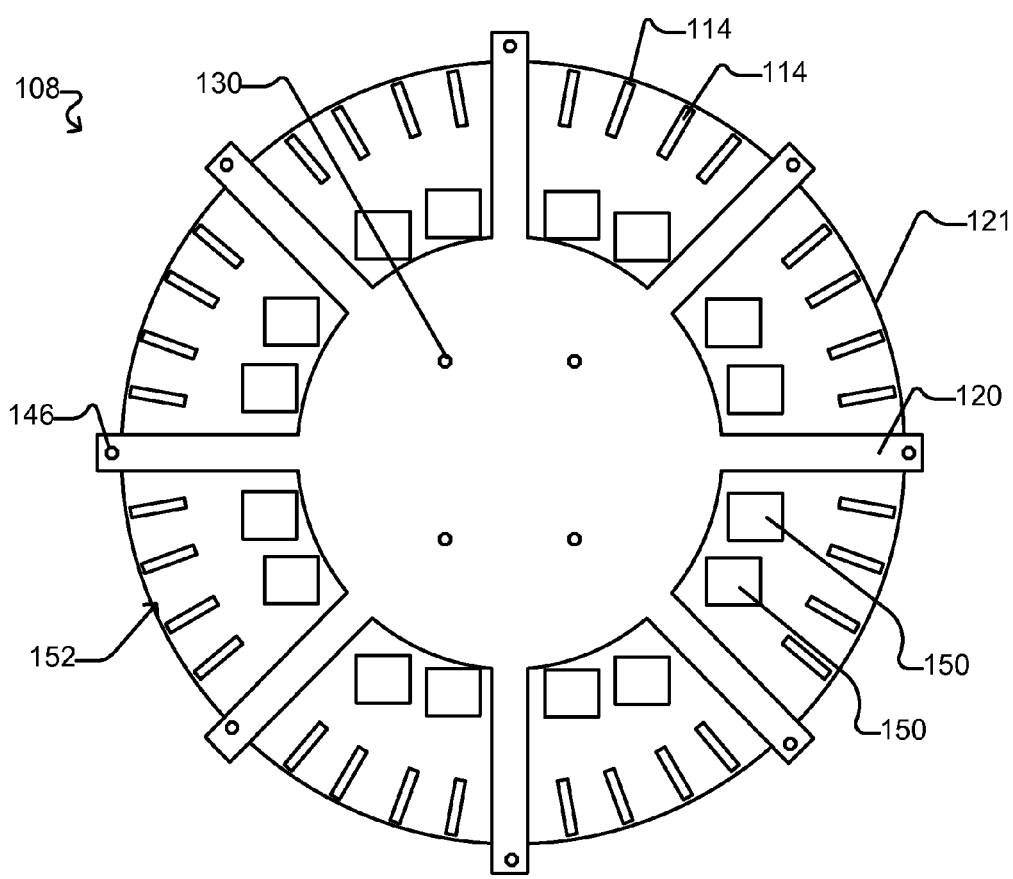
FIG. 1C illustrates a top view of the probe card assembly of FIG. 1B.

Accordingly, in some embodiments of the invention, a system for wireless verification of a probe card assembly is provided. An embodiment of such a system 100 is illustrated in FIG. 1A, and the probe card assembly 108 of FIG. 1A is illustrated in FIGS. 1B and 1C. The system 100 can include a prober 102 and a test head 104. A cutaway 126 provides a partial view of the inside of the prober 102. A probe card assembly 108 can be mounted into the prober 102 and can include probes 124. The probe card assembly 108 can include an electrical interface 114 to the test head 104. The probes 124 can be arranged in a pattern which corresponds to pads 128 of a device under test (DUT) 112. The DUT 112 can be, for example, a semiconductor wafer which includes a number of unsingulated dies, a number of singulated dies held in a carrier, or the like. To test a DUT 112, the DUT 112 can be placed on a chuck, stage, or the like 106, and the probe card assembly 108 and DUT 112 can be brought together to make temporary electrical connects between the probes 124 and the pads 128 of the DUT 112. Test and response signals can be exchanged between the tester (not shown but can be connected to the test head 104 by cable 110) and probe card assembly 108 via a cable 110 and the test head 104. Alternatively or in addition, test and response signals can be sourced and sinked from the test head 104 using electronics (not shown) in the test head 104.

In some embodiments of the invention, the probe card assembly 108 can include a stiffener 120, a wiring substrate 121, a probe head 122, probes 124, and test circuitry 150. The probes 124 can be disposed on the probe head 122. Various types of probes 124 can be used. For example, the probes 124 can be resilient and can include an electrically-conductive material to allow an electronic signal to be transmitted through the probes 124. Examples of probes 124 include composite structures formed of a core wire overcoated with a resilient material. Other examples of probes 124 include lithographically formed structures. Probes 124 can be, for example, conductive pogo pins, bumps, studs, stamped springs, needles, buckling beams, and the like. The probe card assembly 108 can also include planarization or alignment features (not shown) to allow adjustment of the planarity, orientation, or both, of the probes 124.

The test circuitry 150 can be disposed on an upper surface 152 of the wiring substrate 121, for example, positioned within a recess or open portion of the stiffener 120. Alternatively, or in addition, test circuitry 150 can be disposed on the lower surface 154 of the wiring substrate 121, although this is not shown in the figures. As yet another alternative, test circuitry 150 can be disposed on one or more daughter cards (not shown) that are part of the probe card assembly 108. Regardless of the location or locations of the test circuitry 150, electrical connections 132, 134 can be provided between the tester interface 114, test circuitry 150, and probes 124.

The wiring substrate 121 can be, for example a printed circuit board material, and can include multiple layers (not shown) of an insulating material on which conductive traces (not shown) are formed thereon and vias (not shown) are formed between to provide electrical connections 134 with and between the tester interface 114, wiring substrate 121, probe head 122, probes 124, and test circuitry 150. For example, the wiring substrate 121 can comprise a ceramic, organic, or printed circuit board substrate comprising electrically conductive pads (not shown) on one surface of the substrate and internal conductive paths connecting those pads to terminals (not shown) on another surface of the substrate. The probe head 122 can include one or more substrates (e.g., printed circuit boards, organic layers, ceramic layers, and the like, similar to the wiring substrate 121) on which the probes are mounted (e.g., to conductive terminals).

The probe head 122 can be mechanically coupled to the stiffener 120. The stiffener 120 can be a plate-like rigid structure and can include a rigid material (e.g., metal) which resists warping or bending due to mechanical loads or thermal gradients. The probe head 122 can be coupled to the stiffener 120 so that forces applied to the probe head are passed through to the stiffener, helping to provide rigidity to the probe head. For example, attachment mechanisms 130 can connect the probe head 122 to the stiffener 120. For example, the attachment mechanisms 130 can be fasteners that fix the probe head 122 in position relative to the stiffener. As another example, the attachment mechanisms can be adjustment mechanisms to allow for adjustment of the planarity and orientation of the probe head 122. For example, adjustment mechanisms can include differential screws, biasing springs, actuators, or similar components.

The tester interface 114 can be, for example, zero insertion force connectors, pogo pins, flexible wiring, or the like. The tester interface 114 can for example be connectors which extend from the wiring substrate 121 upward through holes (not shown) in the stiffener 120. The wiring substrate 121 can be fixedly attached to the stiffener 120, or can float between the stiffener 120 and the probe head 122. For example, the wiring substrate 121 can be mechanically coupled to the stiffener 120 in a vertical direction but radially decoupled from the stiffener 120 in a horizontal plane.

The probe card assembly 108 can be mounted into the prober 102 by fixing the probe card assembly to a cardholder 142 (e.g., a head plate or insert ring) of the prober 102. For example, the stiffener 120 and the cardholder 142 can each include holes 136, 144 to receive fasteners 146 (e.g., screws, bolts, and the like) used to secure the probe card assembly 108 in place. Other techniques can be used to secure the probe card assembly 108 in position, including for example, clamping and the like. Holes 136 are therefore just one non-limiting example of an attachment mechanism that can be included in the probe card assembly 108, and other attachment mechanisms, including clamping surfaces, screws, mechanical interlocks, and the like can be used. The probe card assembly 108 can also be docked to the test head 104, for example, by being electrically connected to the electrical interface 114 and/or mechanically attached to the test head 104.

As illustrated in FIG. 1A, the test head 104 can rotate from a closed position shown in FIG. 1A to an open position in which the test head 104 is rotated away from the prober 102. For example, the test head 104 can rotate about a hinge 160 or the like. The test head 104' in an open position is shown in dashed lines in FIG. 1A. While the test head 104 is in an open position, the probe card assembly 108 can be docked to the test head 104. In FIG. 1A, the probe card assembly 108' docked to the test head 108' in an open position is shown in dashed lines. Alternatively, the probe card assembly 108 can be attached to the prober 102 (e.g., to the card holder 142) while the test head 104 is in an open position.

The embodiments of the invention for verifying the probe card assembly 108 discussed herein can be applied while the probe card assembly 108 is mounted to the prober 102 and/or docked to the test head 104. While the probe card assembly 108 is mounted to the prober 102, it can be difficult to access the bottom portions of the probe card assembly 108. While the probe card assembly 108 is docked to the test head 104, it can be difficult to access the top portions of the probe card assembly 108. While the probe card assembly 108 is both mounted to the prober 102 and docked to the test head 108, it can be difficult to access the top portions and the bottom portions of the probe card assembly 108.

Figure 2:
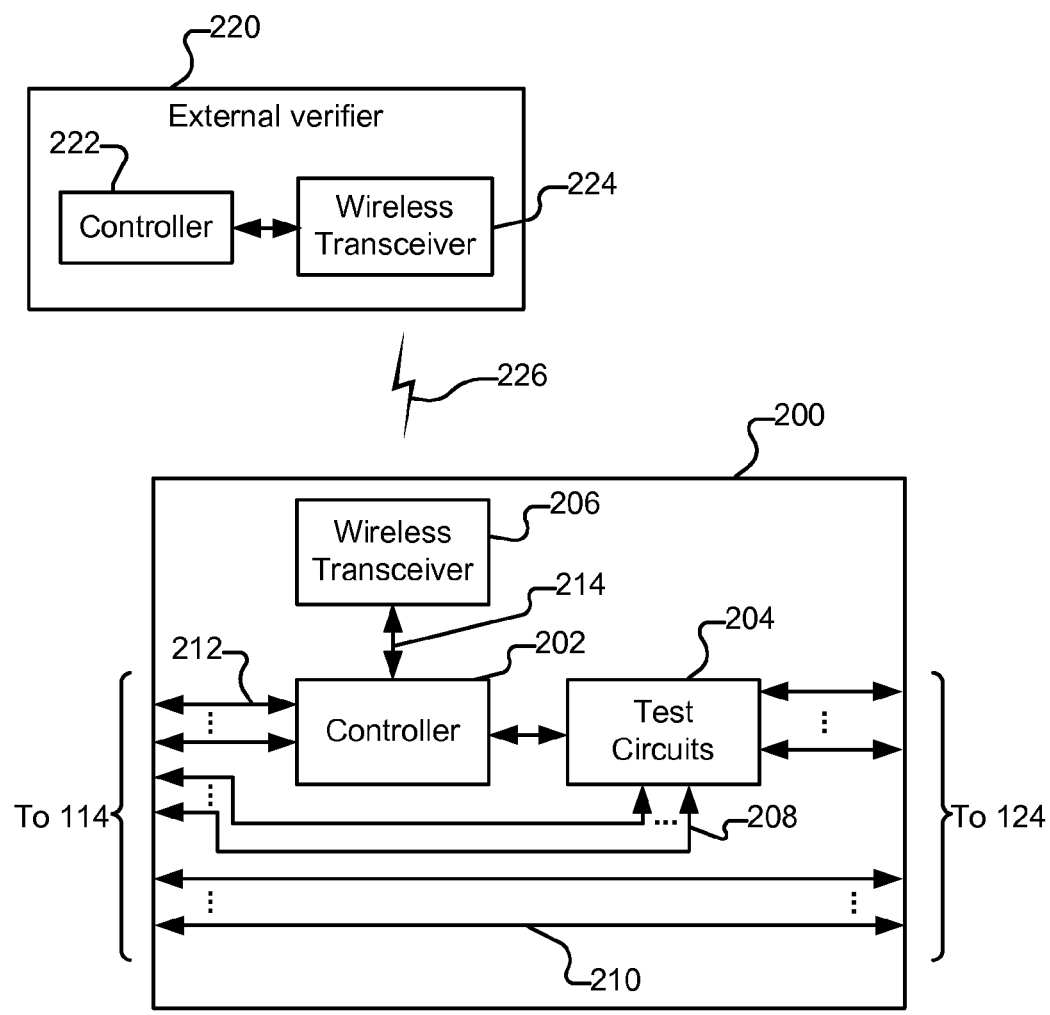
FIG. 2 illustrates an electrical block diagram of a probe card assembly according to some embodiments of the invention.

Returning now to a description of the probe card assembly 108, it is noted that the test circuitry 150 can include a controller and a wireless transceiver in some embodiments of the invention. For example, FIG. 2 illustrates an electrical block diagram of probe card electronics 200 which can be part of the probe card assembly 108. For example, the probe card electronics 200 can be part of the test circuitry 150. The probe card electronics 200 can include a controller 202, test circuits 204, and a wireless transceiver 206. Various types of test circuits 204 can be included. For example, the test circuits 204 can include a measurement function. For example, voltage, current, or frequency can be measured and the result provided to the controller 202. As another example, the test circuits can include test sequencers, timing generators, and the like to allow generation of one or more test vectors in response to commands from the controller 202 or tester. As another example, the test circuits 204 can include test expansion, such as, for example, test resource enhancement and power resource enhancement as described further below.

The test circuits 204 can include a means for providing test resource enhancement. For example, a single output signal from a tester can be duplicated to provide multiple copies of the signal for transmission to different probes (and hence different dies). To avoid problems caused by failed dies, the test resource enhancement can include circuits (e.g., series resistors, shunt resisters, switches, isolation buffers, current limiters, impedance matching, etc.) to allow isolation of failed dies. For example, a single signal from tester interface 114 can be replicated and provided to multiple probes 124. The replication can include series resistors or switches to provide for isolation of a failed die. For example, switches can be controlled by the controller 202. Examples of various techniques for test resource enhancement which can be used in some embodiments of the invention are illustrated in U.S. Pat. Nos. 7,649,366, 7,557,592, and 7,586,300.

The test circuits 204 can also include a means for providing power supply expansion. Power supply expansion can operate similarly to test resource expansion, allowing a single power signal source from the tester to be provided to multiple dies. To avoid problems caused by failed dies, the power supply expansion can include circuits (e.g., regulators, switches, transistors, etc.) to allow isolation of failed dies. In some instances, additional power can be sourced from a power supply separate from the tester. The tester power input can be used to control multiple power inputs to the dies to ensure that the power supplies are properly sequenced and controlled during testing. This can allow the tester to control the power input to the dies, without requiring the tester to actually supply all of the power. Examples of techniques for power supply expansion are illustrated in U.S. Patent Pub. No. 2009/0273358 and U.S. Pat. Nos. 7,649,366 and 7,557,592.

The controller 202 can interface to the test head 104 (and a tester (not shown) through cable 110) via the tester interface 114. The controller 202 can convert between signals exchanged with the tester (not shown) via the tester interface 114 and signals passed to and from DUT 112 via the probes 124. For example, the controller 202 can convert test commands received from the tester (not shown) via the tester interface 114 into test signals applied to one or more of the probes 124. The controller 202 can also convert test commands into a sequence of test signals provided to one or more of the probes 124. For example, a test command can correspond to a high level instruction (e.g., memory write) which is converted by the controller 202 into multiple signal cycles (e.g., address set up and strobe, data set up and strobe). Alternatively, or in addition, test commands can correspond directly to signals provided to the probes 124. The controller 202 can also convert response signals from the DUT 112 and received through one or more of the probes 124 into response status passed to the tester (not shown) via the tester interface 114. For example, a response status can correspond to the result of a high level test command (e.g., memory write failed to one or more dies). Alternatively, or in addition, response status can correspond directly to signals received from one or more of the probes 124. If desired, the probe card electronics 200 can also include one or more direct electrical connections 210 between the tester interface 114 and the probes 124 which bypass the controller 202. If desired, the probe card electronics 200 can also alternatively or in addition include direct electrical connections 208 between the tester interface 114 and the test circuitry 204 which bypass the controller 202. For example, test signals (e.g., power and DC test resources to be provided to/from the DUT 112) which have test resource expansion can be routed from the tester interface 114 to the test circuitry 204 via connections 208, while test signals that do not have test resource expansion can be routed from the tester interface 114 directly to the probes 124. Other signals, such as control/status signals used for control of the probe card electronics 200 by the tester (not shown) can be routed from the tester interface to the controller 202 via connections 212.

The controller 202 can include a boundary scan interface 214 which is electrically connected to the wireless transceiver 206. For example, the boundary scan interface 214 can be a Joint Test Access Group (JTAG) compliant interface. The Institute of Electrical and Electronic Engineers (IEEE) standard number 1149.1 defines an industry standard for JTAG boundary scan interfaces. The boundary scan interface 214 can be used to control and sample input/output pins from/to the controller 202. For example, JTAG commands provided to the boundary scan interface 214 can be used to set the state of output pins from the controller 202 (e.g., outputs to the tester interface 114 or to the test circuits 204). JTAG status can be used to read the state of input pins to the controller 202 (e.g., inputs from the tester interface 114 or from the test circuits 204). In general, the boundary scan interface 214, which as noted can be a JTAG compliant interface, can accept electrical signals which are test data in (TDI), test data out (TDO), test mode select (TMS), and test clock (TCK). If desired, an additional electrical signal corresponding to a test reset (TRST) can be included. Multiple devices with JTAG compliant interfaces (e.g., components on a probe card assembly) can be have their TDI and TDO connected together in a serial chain and share a common TCK and TMS to allow multiple DUTs 112 to be tested/controlled via a single JTAG port.

The wireless transceiver 206 can establish a wireless communications link 226 with an external verifier (e.g., debugger) 220, which can include a controller 222 (e.g., a personal computer, a microprocessor, or the like) and a wireless transceiver 224. For example, the wireless communications link 226 can use free-space propagating radio waves to communicate data. In some embodiments, the data can be digital information modulated on radio frequency signal. Various data encoding and modulated formats can be used, including for example: amplitude modulation, frequency modulation, phase modulation, and the like and combinations thereof. The wireless communications link can include error control encoding, including for example: forward error correction, error detection, and the like and combinations thereof. Accordingly, the wireless transceiver 206 and 224 can include components such as one or more: modulators, demodulators, data formatters, encoders/decoders, upconverters, downconverters, amplifiers, filters, antennas, and the like. In some embodiments, the wireless link 226 can use existing communications techniques, such as for example: IEEE 802.15.4 ("ZigBee"), IEEE 802.15.1 ("Bluetooth"), IEEE 802.11 ("Wi-Fi") wireless, and the like.

In accordance with some embodiments, JTAG commands and status can be communicated via the wireless link 226 between the wireless transceiver 206 in the probe card electronics 200 on the probe card assembly 108 and the wireless transceiver 224 in the external verifier 220. In other words, the wireless link 226 can communicate information to allow the JTAG signals present at the boundary scan interface 214 to be reproduced at the external verifier 220. Of course, the wireless link 226 may introduce some amount of delay, but the JTAG signals can be reproduced with sufficient fidelity to allow the external verifier 220 to operate using normal JTAG signals as if the external verifier 220 was directly connected to the boundary scan interface 214. The wireless link 226 can communicate the JTAG signals so that the wireless link 226 is essentially transparent and the external verifier 220 can operate as though it is directly connected to the boundary scan interface 214. Various JTAG debugging systems are available on the market which can be used with some embodiments of the present invention. In some embodiments, the wireless transceiver 224 in the external verifier 220 and the wireless transceiver 206 in the probe card electronics 200 can include circuitry for compressing/decompressing the JTAG signals so that the JTAG signals wirelessly transmitted over the link 226 between the external verifier 220 and the probe card electronics 200 are compressed.

In accordance with other embodiments, the wireless transceiver 206 and/or the controller 202 can include electronics (not shown) that can translate high level commands received on the wireless communications link 226 into one or more JTAG commands provided to the boundary scan interface 214. Those JTAG commands can control operation of the probe card electronics 200. For example, JTAG commands can cause the controller 202 to change modes of operation or the operation of the probe card electronics 200. For example, a JTAG command can cause the controller 202 to loopback signals on the tester interface 114. As another example, JTAG commands can include sampling the state of an input to the controller 202, setting an output from the controller 202 to a particular state, setting a signal on the tester interface 114 to a particular state, sampling the state of a signal on the tester interface, and the like.

Figure 3:
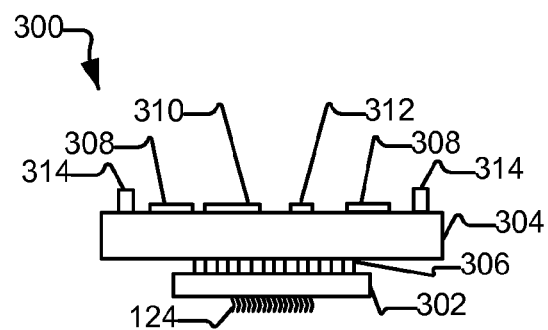
FIG. 3 illustrates a side view of a probe card assembly according to some embodiments of the invention.
Figure 4:
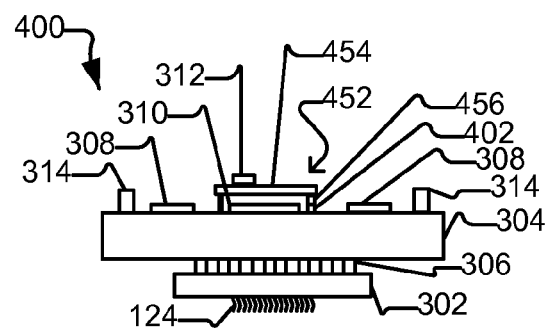
FIG. 4 illustrates a side view of another probe card assembly according to some embodiments of the invention.

Turning to FIGS. 3-4, various arrangements of portions of the probe card assembly 108 are shown in accordance with some embodiments of the invention. For simplicity, many of the elements (e.g., stiffener, mounting structure, etc.) of the probe card assemblies have been omitted.

FIG. 3 illustrates a probe card assembly 300 (which can, for example, include the probe card electronics 200 of FIG. 2). The probe card assembly 300, which can be an example of the probe card assembly 108, can include a first substrate 302 on which resilient probes 124 are disposed. Coupled to the first substrate 302 can be a second substrate 304 on which the tester interface 114 is disposed. The first substrate 302 and second substrate 304 can be electrically interconnected by electrical connections 306, which can be, for example, a flexible circuit board, wires, coaxial cables, an interposer, or the like. Also disposed on the second substrate 304 can be one or more test circuits 308. The test circuits 308 can be, for example, like test circuitry 150 and/or probe card electronics 200 described above. The test circuits 308 can include test resource enhancement circuitry, for example, as described above. The test circuits 308 can also include power resource enhancement, for example, as described above.

Also disposed on the second substrate 304 can be a controller 310, which can be like the controller 202 described above. For example, the controller 310 can control operation of the probe card assembly 300. The controller 310 can include a boundary scan interface (e.g., 214) which can electrically connect (e.g., through printed circuit board traces) to a wireless transceiver 312. The wireless transceiver 312 can be like the wireless transceiver 206 described above. For example, the wireless transceiver 206 can communicate JTAG commands and status via a wireless link (e.g., 226) with an external verifier 220 as described above. As another example, the wireless transceiver 312 can communicate high level commands and status with the external verifier 220. The wireless transceiver 312 can translate between the high level commands and JTAG commands and status on the boundary scan interface (e.g., 214) as described above.

Turning to FIG. 4, another arrangement of a probe card assembly 400 is illustrated. The probe card assembly 400, which can be an example of the probe card assembly 108, is similar to the probe card assembly 300, except that the wireless transceiver 312 is disposed on a daughter card 452. The daughter card 452 can be sized to fit within the space between the test head 104 and the probe card assembly 400 when the probe card assembly 400 has been installed in a prober 102 (e.g., in place of the probe card assembly 108 in FIG. 1A). The daughter card 452 can include a substrate 454 on which an electrical connector 456 is mounted. The electrical connector 456 can electrically connect to a boundary scan connector 402 disposed on the probe card assembly 400. The boundary scan connector 402 can provide a boundary scan interface like the boundary scan interface 214 described above. A mechanical mounting structure (not shown) for coupling the daughter card 452 to the base probe card assembly (e.g., second substrate 304) can also be included. The daughter card 452 can thus be removed from the probe card assembly 400 when no longer required for debugging. One daughter card 452 can thus be shared or reused to allow debugging multiple probe card assemblies.

Figure 5:
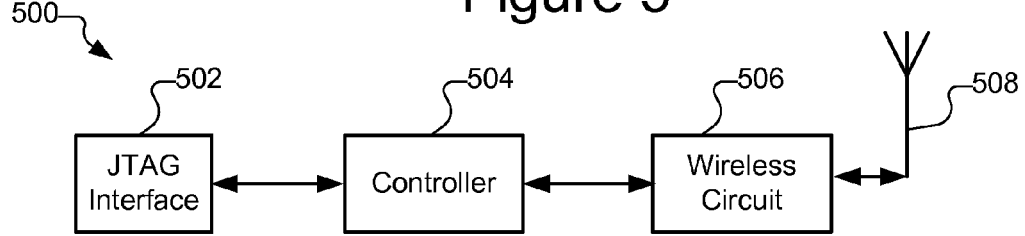
FIG. 5 illustrates a block diagram of a wireless transceiver according to some embodiments of the invention.

Turning to FIG. 5, one embodiment of a wireless transceiver 500 that can be an example of, and thus used as, wireless transceiver 206 of FIG. 2 is illustrated. The wireless transceiver 500 can include a controller 504 and a JTAG interface 502. The JTAG interface 502 can be an example of the boundary scan interface 214 on the probe card assembly (e.g., probe card assembly 108, 200, 300, 400). The JTAG interface 502 can provide for output of JTAG control signals from the controller 504 to the JTAG interface 502 to enable the controller 504 to control the probe card assembly. The JTAG interface 502 can also provide for input of JTAG status signals to the controller 504 to enable the controller to monitor operation of the probe card assembly.

A wireless link (e.g., link 226 in FIG. 2) can be established between the controller 504 and the external verifier 220 using the wireless circuit 506 and antenna 508. For example, the wireless circuit 506 can provide for transmission and reception of data using wireless techniques as described above. The wireless circuit 506 can thus be an example of wireless transceiver 206 in FIG. 2.

The controller 504 can translate between high level commands/status communicated over the wireless communications link (e.g., line 226 in FIG. 2) and JTAG commands/status provided to the JTAG interface 502, for example, as described above. The controller 504 can be programmed using software in the form of machine executable instructions stored within a machine readable medium. For example, the machine readable medium can be a non-transitory medium including, for example, such as read only memory, flash memory, magnetic memory, and the like.

Figure 6:
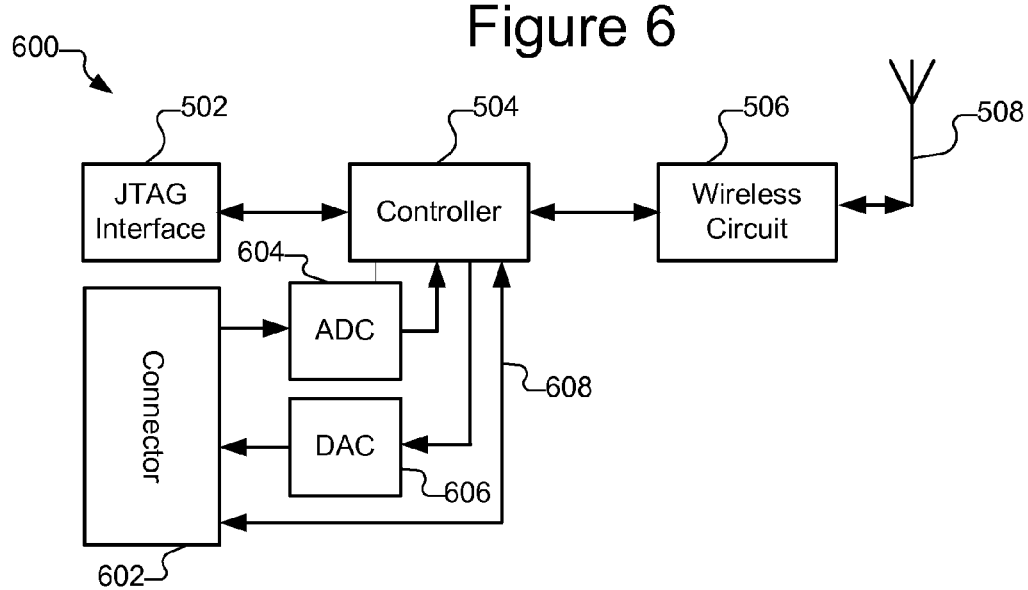
FIG. 6 illustrates a block diagram of another wireless transceiver according to some embodiments of the invention.

Turning to FIG. 6, another example of an embodiment of the wireless transceiver 206 of FIG. 2 is illustrated. The wireless transceiver 600 of FIG. 6 can be generally similar to wireless transceiver 500 except that the wireless transceiver 600 can include additional circuitry to provide additional functionality. For example, the wireless transceiver 600 can include an analog to digital converter 604 which can be used to measure voltages on the probe card assembly. For example, connections to signals to be monitored on the probe card assembly can be provided to a connector to which the connector 602 attaches. The wireless transceiver 600 can also include a digital to analog converter 606 which can be used to generate voltages provided to the probe card assembly. The controller 504 can also include additional input and output lines to provide direct input and output of signals 608 to the probe card assembly. The controller 504 can translate between high level commands/status communicated over the wireless communications link (e.g., link 226 in FIG. 2) and input/output control of the analog to digital converter 604, digital to analog converter 606, and input and output signals 608.

Figure 7:
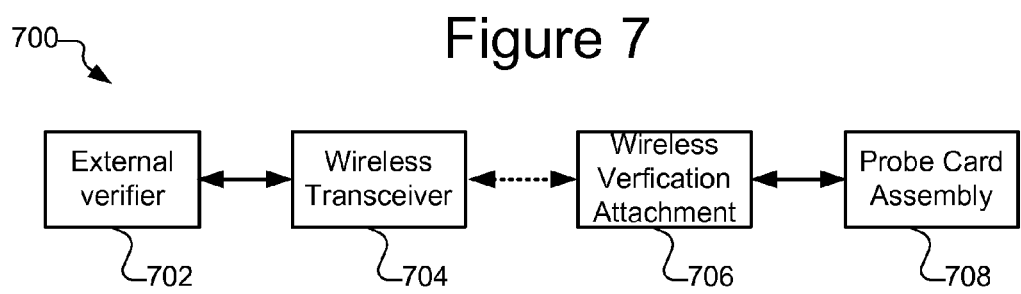
FIG. 7 illustrates a system for wireless verification of a probe card assembly according to some embodiments of the invention.

Turning to FIG. 7, a block diagram of a system 700 for wireless verification (e.g., debugging) of a probe card assembly is illustrated. The system includes an external verifier 702, a wireless transceiver 704, a wireless verification (e.g., debugging) attachment 706, and a probe card assembly 708. The probe card assembly 708 can be, for example, like any of probe card assemblies described above (e.g., probe card assembly 108, 300, 400). The probe card assembly 708 can be installed in a prober (e.g., prober 102 of FIG. 1A).

The wireless verification attachment 706 can be, for example, the probe card electronics 200 of FIG. 2. The external verifier 702 can be, for example, the external verifier 220 of FIG. 2, and the wireless transceiver 704 can be, for example, the wireless transceiver 224 in FIG. 2.

The wireless verification attachment 706 can interface to the probe card assembly 708 and can include a wireless transceiver (not shown), for example, like wireless transceivers 206, 312, 500, 600. The wireless verification attachment 706 (which can be part of the probe card assembly 708) can include a daughter card, for example, like daughter card 452. The wireless verification attachment 706 can communicate wirelessly with the wireless transceiver 704 coupled to the external verifier 702. The external verifier 702 can, for example, be a personal computer or the like. The external verifier 702 can include software to provide a user interface, allowing a user to control operation of the probe card assembly 708. For example, the user interface can allow a user to set signals on the probe card assembly 708 to a desired state, sample the state of signals on the probe card assembly, measure the voltage of a signal on the probe card assembly, set the voltage of a signal on the probe card assembly, or other operations. The user interface can provide a display function which operates like an oscilloscope or logic analyzer, displaying periodically sampled values of signals on the probe card assembly.

Turning to FIG. 8, a method for verifying (e.g., debugging) a probe card assembly is illustrated. The method 800 can include the operation 802 of obtaining a probe card assembly. The probe card assembly can include a tester interface (e.g., tester interface 114 in FIGS. 1A and 1B), a plurality of probes (e.g., probes 124 in FIGS. 1A-1C), and a wireless transceiver (e.g., transceiver 206 in FIG. 2). For example, the probe card assembly can be like any of the probe card assemblies 108, 300, 400 described above. Obtaining the probe card assembly can include installing a daughter card which has a wireless transceiver (e.g., daughter card 452) onto a base probe card assembly (e.g., probe card assembly 400).

Another operation 804 of the method 800 can be installing the probe card assembly in a prober. The probe card assembly can be bolted or otherwise installed into the prober (e.g., prober 102 of FIG. 1A), for example as described above. The probe card assembly can be electrically interfaced to a test head (e.g., test head 104 of FIG. 1A) for example as described above.

The method can also include the operation 806 of establishing a wireless communications link (e.g., link 226 in FIG. 2) between the wireless transceiver (e.g., transceiver 206 in FIG. 2) and an external verifier (e.g., verifier 220 in FIG. 2) positioned outside of the prober. The wireless communications link can be used for the operations of communicating commands from the external verifier to the probe card assembly (operation 808) and communicating status from the probe card assembly to the external verifier (operation 810).

The commands and status can, in some embodiments, correspond to JTAG compliant signals, for example as described above. In other embodiments, the commands and status can be high level commands, which are converted on the probe card assembly (e.g., by the wireless transceiver) into JTAG compliant signals, and high level status which is converted from multiple JTAG operations. For example, commands can provide for setting the state of at least one signal on the tester interface (between the test head and the probe card assembly), setting the state of at least one signal at the probes, or both. As another example, status can include the state of at least one signal at the tester interface, the state of at least one signal at the probes, or both. Accordingly, the external verifier can provide a display corresponding to at least one signal within the probe card (e.g., a virtual oscilloscope or logic analyzer).

In some embodiments of the invention, testing and verifying (e.g., debugging) of a probe card assembly can be simplified by the use of a wireless link. For example, an external verifier (e.g., verifier 220 in FIG. 2) can be used to view and control individual input/output signals of the probe card assembly to assist in resolving connection problems. In some instances, testing in this manner can resolve problems before even loading firmware or performing other time consuming initialization operations. In another example, the external verifier can be used to view and control individual input/output signals of the probe card assembly during operation of the probe card assembly. This can, in some instances, allow detection of problems which occur during operation of the probe card assembly in operational configurations that are difficult to reproduce in a laboratory environment.

Although specific embodiments and applications of the invention have been described in this specification, these embodiments and applications are exemplary only, and many variations are possible. Accordingly, there is no intention that the invention be limited to these exemplary embodiments and applications or to the manner in which the exemplary embodiments and applications operate or are described herein. For example, features shown in one embodiment can be combined with features shown in another embodiment. Accordingly, it is not intended that the invention be limited except as by the claims set forth below.

I claim:

1. A probe card assembly comprising:
   a first substrate;
   a plurality of resilient probes disposed on said first substrate and arranged to contact corresponding pads of a device under test (DUT);
   a tester interface configured to provide a communications link with a tester for controlling testing of said DUT;
   a controller coupled to said tester interface and comprising a debugger interface to a debugger for debugging said probe card assembly, wherein said debugger is a distinct and different piece of equipment than said tester and said debugger interface is a distinct and different interface than said tester interface; and
   a wireless transceiver configured to establish a wireless communications link between said debugger interface and said debugger, wherein said wireless communications link is a distinct and different communications link than said communications link to said tester.

2. The probe card assembly of claim 1, wherein said debugger interface is a boundary scan interface.

3. The probe card assembly of claim 2, wherein said boundary scan interface is a joint test access group (JTAG) compliant interface.

4. The probe card assembly of claim 3, wherein said wireless transceiver communicates JTAG commands and status across said wireless communications link.

5. The probe card assembly of claim 3, wherein said wireless transceiver translates commands received on said wireless communications link into a plurality of JTAG commands on said boundary scan interface.

6. The probe card assembly of claim 1, further comprising a second substrate coupled to said first substrate, wherein said tester interface is disposed on said second substrate.

7. The probe card assembly of claim 6, further comprising a daughter card coupled to said second substrate, wherein said wireless transceiver is disposed on said daughter card.

8. The probe card assembly of claim 1 further comprising a test circuit electrically coupled to said tester interface and electrically coupled to ones of said probes, wherein said test circuit comprises a means for providing test resource enhancement.

9. The probe card assembly of claim 1 further comprising a test circuit electrically coupled to said tester interface and electrically coupled to ones of said probes, wherein said test circuit comprises a means for providing power supply expansion.

10. The probe card assembly of claim 1, wherein said controller controls operation of said probe card assembly based on commands received via said wireless communications link.

11. The probe card assembly of claim 1, wherein said debugger is a verifier.

12. A wireless verification attachment for a probe card assembly comprising:
    a substrate sized to fit within a space between a test head and a probe card assembly when said probe card assembly is installed into a prober;
    an electrical connector disposed on said substrate and positioned to mechanically and electrically connect to a tester interface disposed on said probe card assembly and configured to provide a communications link with a tester for controlling testing of a device under test (DUT); and
    a wireless transceiver comprising a debugger interface and capable of establishing a wireless communications link with a debugger for debugging said probe card assembly,
    wherein:
       said debugger is a distinct and different piece of equipment than said tester,
       said debugger interface is a distinct and different interface than said tester interface, and
       said wireless communications link is a distinct and different communications link than said communications link to said tester.

13. The wireless verification attachment of claim 12, wherein said debugger interface is a boundary scan interface.

14. The wireless verification attachment of claim 13, wherein said boundary scan interface comprises a joint test access group (JTAG) compliant interface.

15. The wireless verification attachment of claim 14, wherein said wireless transceiver replicates JTAG signals of said debugger at said electrical connector using information transferred across said wireless communications link.

16. The wireless verification attachment of claim 14, further comprising a controller electrically coupled to said wireless transceiver and said electrical connector, wherein said controller generates JTAG signals at said electrical connector using information transferred across said wireless communications link.

17. The wireless verification attachment of claim 16, wherein said controller translates commands received across said wireless communications link into a plurality of JTAG commands at said electrical connector.

18. The wireless verification attachment of claim 12, wherein said debugger is a verifier.

19. A method of probe card verification comprising:
   obtaining a probe card assembly, wherein said probe card assembly comprises:
      a tester interface for providing a communications link with a tester for controlling testing of a device under test (DUT),
      a controller electrically coupled to said tester interface wherein said controller controls operation of said probe card assembly, said controller comprising a debugger interface to a debugger configured to debug said probe card assembly, said debugger interface is a distinct and different interface than said tester interface,
      a wireless transceiver electrically coupled to said debugger interface, and
      a plurality of resilient probes arranged to contact corresponding pads on said DUT and coupled to said controller;
   installing said probe card assembly in a prober with said tester interface connected to a test head of said prober;
   establishing with said wireless transceiver a wireless communications link between said debugger interface and said debugger, wherein said debugger is positioned outside of said prober, said debugger is a distinct and different piece of equipment than said tester, and said wireless communications link is a distinct and different link than any communications link from said tester interface to said tester; and
   using said wireless communications link to communicate commands from said debugger to said controller while said probe card assembly is installed in said prober and connected to said test head; and
   using said wireless communications link to communicate status from said controller to said debugger while said probe card assembly is installed in said prober and connected to said test head.

20. The method of claim 19, wherein said debugger interface is a boundary scan interface.

21. The method of claim 20, wherein said commands and said status correspond to joint test access group (JTAG) compliant signals replicated at said boundary scan interface.

22. The method of claim 21, wherein said wireless transceiver converts JTAG compliant signals at said boundary scan interface and the commands and status communicated across said wireless communications link.

23. The method of claim 19, wherein said status comprises a state of at least one signal at said tester interface.

24. The method of claim 19, wherein said status comprises a state of at least one signal at said resilient probes.

25. The method of claim 19, wherein said commands comprise setting a state of at least one signal at said tester interface.

26. The method of claim 19, wherein said commands comprise setting a state of at least one signal at said resilient probes.

27. The method of claim 19, wherein said debugger provides a display corresponding to at least one signal within said probe card assembly.

28. The method of claim 19, wherein said obtaining comprises installing a daughter card comprising said wireless transceiver onto a probe card base comprising said controller.

29. The method of claim 19, wherein said debugger is a verifier.

* * * * *